United States Patent
Meiser et al.

(10) Patent No.: US 9,852,945 B2
(45) Date of Patent: Dec. 26, 2017

(54) METHOD OF MANUFACTURING A SEMICONDUCTOR DEVICE HAVING A CELL FIELD PORTION AND A CONTACT AREA

(71) Applicant: Infineon Technologies Austria AG, Villach (AT)

(72) Inventors: Andreas Meiser, Sauerlach (DE); Till Schloesser, Munich (DE); Martin Poelzl, Ossiach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/962,573

(22) Filed: Dec. 8, 2015

(65) Prior Publication Data

US 2016/0093529 A1   Mar. 31, 2016

Related U.S. Application Data

(62) Division of application No. 13/664,792, filed on Oct. 31, 2012, now Pat. No. 9,231,100.

(51) Int. Cl.
H01L 21/768    (2006.01)
H01L 29/40    (2006.01)
(Continued)

(52) U.S. Cl.
CPC ...... H01L 21/76897 (2013.01); H01L 21/283 (2013.01); H01L 21/76 (2013.01);
(Continued)

(58) Field of Classification Search
CPC ............. H01L 29/0696; H01L 29/4236; H01L 29/7813; H01L 29/407; H01L 29/7397;
(Continued)

(56) References Cited

U.S. PATENT DOCUMENTS 8,546,953 B2    10/2013   Horng et al.
2005/0098826 A1    5/2005   Yamaguchi et al.
(Continued)

FOREIGN PATENT DOCUMENTS

CN    102549754 A    7/2012
DE    19606105 A1    8/1996
WO    2005022530 A1    3/2005

*Primary Examiner* — Marc Armand
*Assistant Examiner* — Quinton Brasfield
(74) *Attorney, Agent, or Firm* — Murphy, Bilak & Homiller, PLLC

(57) ABSTRACT

A semiconductor device is manufactured at least partially in a semiconductor substrate. The substrate has first and second opposing main surfaces. The method includes forming a cell field portion and a contact area, the contact area being electrically coupled to the cell field portion, and forming the cell field portion by at least forming a transistor. The method further includes insulating a part of the semiconductor substrate from other substrate portions to form a connection substrate portion, forming an electrode adjacent to the second main surface so as to be in contact with the connection substrate portion, forming an insulating layer over the first main surface, forming a metal layer over the insulating layer, forming a trench in the first main surface, and filling the trench with a conductive material, and electrically coupling the connection substrate portion to the metal layer via the trench.

4 Claims, 12 Drawing Sheets

(51) Int. Cl.
  *H01L 29/66*    (2006.01)
  *H01L 29/78*    (2006.01)
  *H01L 21/283*    (2006.01)
  *H01L 21/76*    (2006.01)
  *H01L 29/06*    (2006.01)

(52) U.S. Cl.
  CPC ...... *H01L 29/407* (2013.01); *H01L 29/66666* (2013.01); *H01L 29/66734* (2013.01); *H01L 29/7811* (2013.01); *H01L 29/7813* (2013.01); *H01L 29/0653* (2013.01)

(58) Field of Classification Search
  CPC ........... H01L 27/1157; H01L 29/66712; H01L 29/7802; H01L 29/7825
  See application file for complete search history.

(56) References Cited

U.S. PATENT DOCUMENTS

| | | | |
|---|---|---|---|
| 2007/0228496 A1* | 10/2007 | Rochefort | H01L 29/0634 257/409 |
| 2009/0127624 A1* | 5/2009 | Sumitomo | H01L 21/76243 257/350 |
| 2010/0044788 A1* | 2/2010 | Hirler | H01L 29/0634 257/335 |
| 2012/0012924 A1 | 1/2012 | Meiser et al. | |
| 2012/0146130 A1 | 6/2012 | Hirler et al. | |
| 2012/0146133 A1 | 6/2012 | Hirler et al. | |
| 2012/0225540 A1 | 9/2012 | Schulze et al. | |
| 2013/0075814 A1 | 3/2013 | Meiser et al. | |

\* cited by examiner

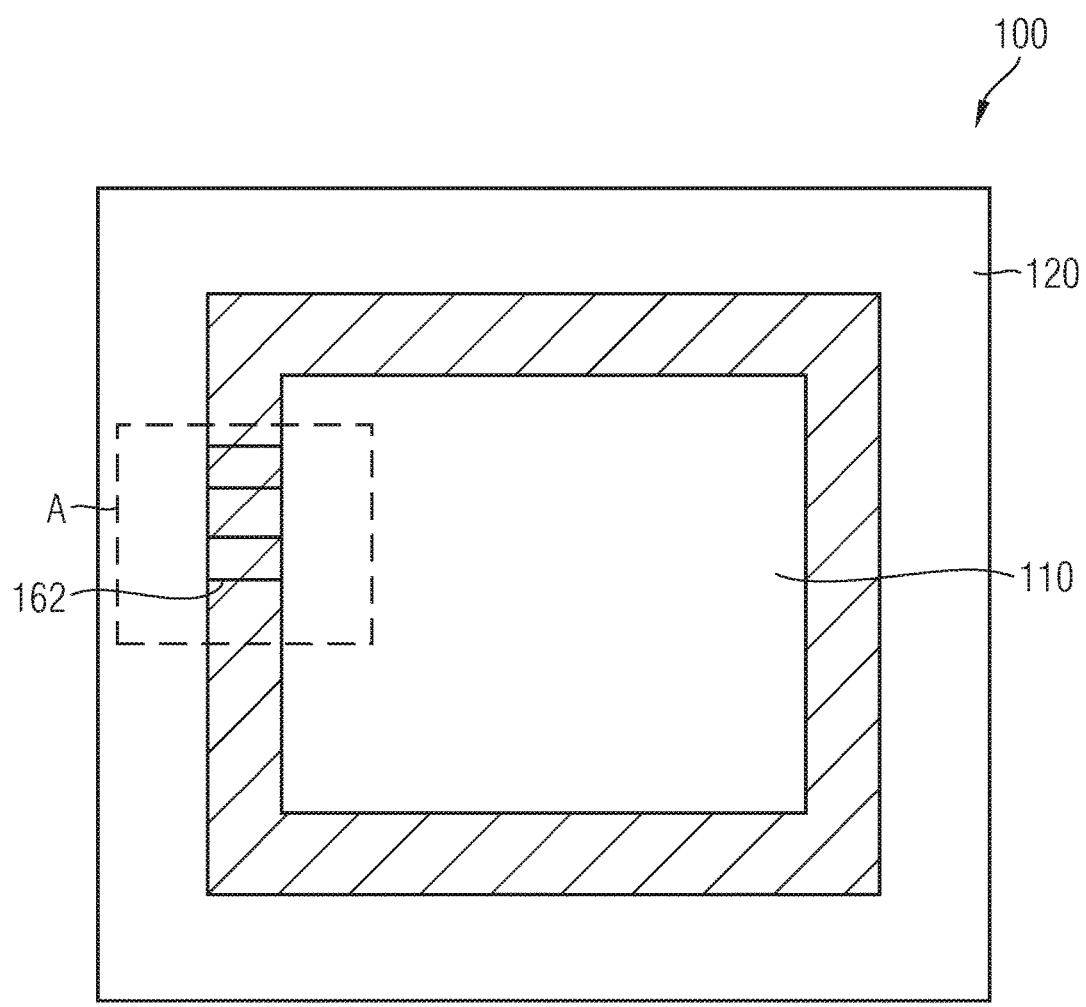

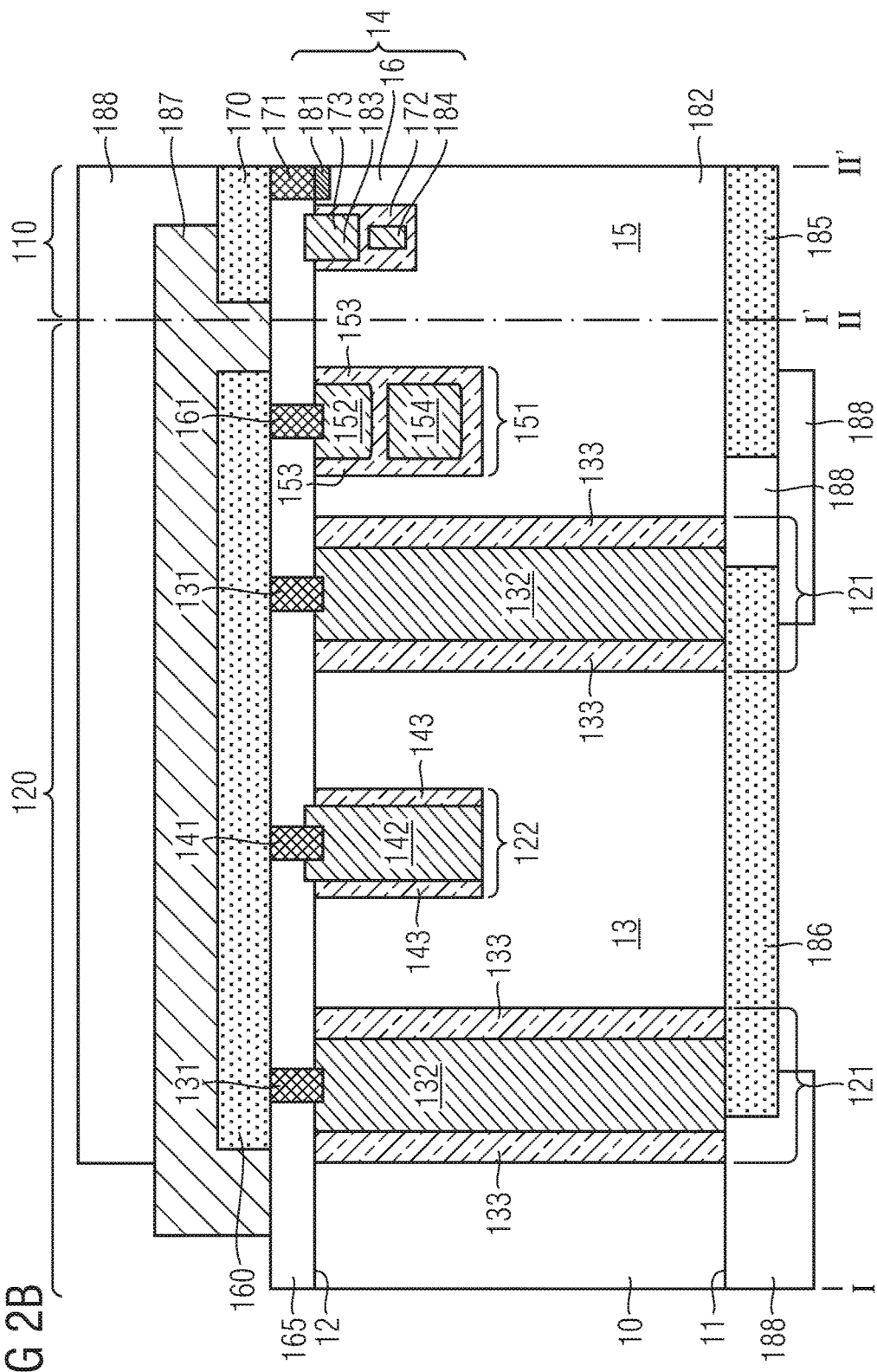

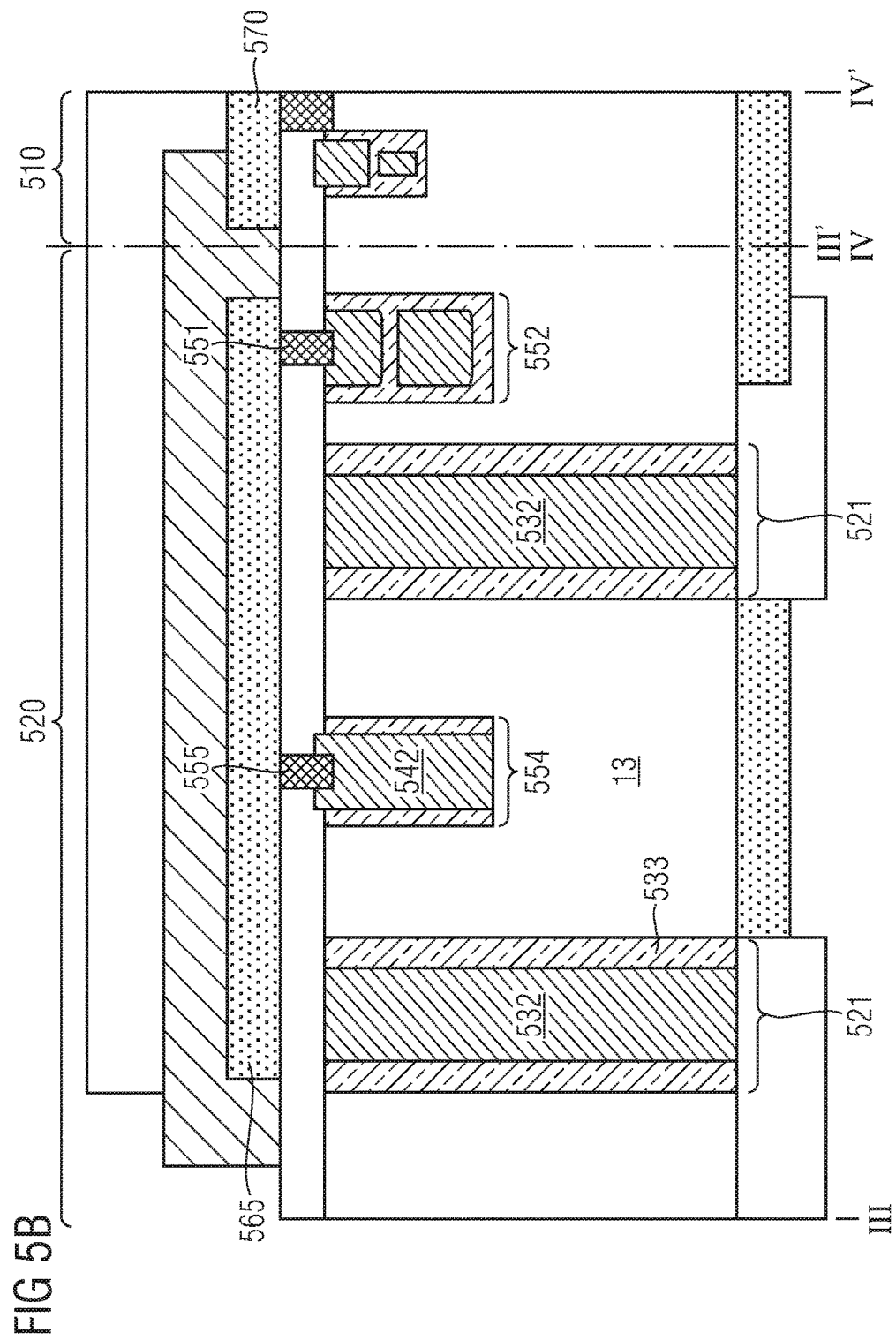

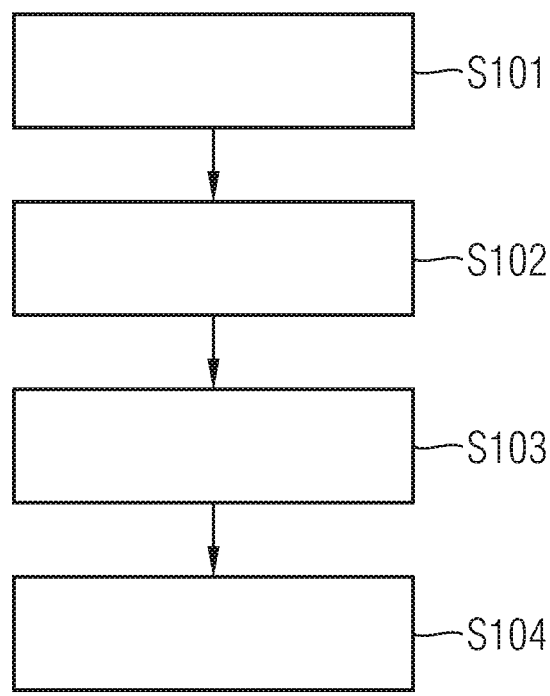

METHOD OF MANUFACTURING A SEMICONDUCTOR DEVICE HAVING A CELL FIELD PORTION AND A CONTACT AREA

TECHNICAL FIELD

The present disclosure relates to a semiconductor device and to a method for manufacturing such a semiconductor device.

BACKGROUND

Power MOSFETs (Metal Oxide Semiconductor Field Effect Transistor) are examples of high breakdown voltage semiconductor devices which are used for switching power sources, inverter devices or the like. For example, power MOSFETs are considered to switch high voltages at low-ohmic load so as to have a very small switching and conduction loss. Vertical field-effect transistors (FET) in source-down structure are vertical FETs, in which drain and gate terminals are located on one side (top side) of a semiconductor substrate, while the source terminal is located on the other side (back side) of the semiconductor substrate. These FETs are useful in applications in which the source terminal of a semiconductor device is at a reference potential and in applications which require a good cooling. One possible application area for these semiconductor devices is in the automotive industry. Due to the source-down structure, energy may be efficiently dissipated which results in a further shrink of Ron. In these devices, it is desirable to lead potentials, which are different from the source potential, to the top side of the substrate.

Accordingly, it is desirable to develop new concepts of a semiconductor device. Further, it is desirable develop a new method for manufacturing such a semiconductor device.

SUMMARY

According to an embodiment, a semiconductor device is at least partially formed in a semiconductor substrate, the semiconductor substrate comprising a first and a second main surface, the first and the second main surfaces being opposed to each other. The semiconductor device comprises a cell field portion and a contact area, the contact area being electrically coupled to the cell field portion, the cell field portion comprising at least a transistor. The contact area includes a connection substrate portion insulated from other substrate portions and comprising a part of the semiconductor substrate, the connection substrate portion not being electrically coupled to a component of the cell field portion by a conductive material disposed between the first and the second main surface, an electrode adjacent to the second main surface and in contact with the connection substrate portion, a metal layer disposed over the first main surface, the connection substrate portion being electrically coupled to the metal layer to form a contact between the electrode and the metal layer.

According to a further embodiment, a semiconductor device is at least partially formed in a semiconductor substrate, the semiconductor substrate comprising a first and a second main surface, the first and the second main surfaces being opposed to each other. The semiconductor device comprises a cell field portion and a contact area, the contact area being electrically coupled to the cell field portion, the cell field portion comprising at least a transistor, the contact area comprising a connection substrate portion insulated from other substrate portions and comprising a part of the semiconductor substrate. The contact area further comprises an electrode adjacent to the second main surface and in contact with the connection substrate portion, a metal layer disposed over the first main surface, the connection substrate portion being electrically coupled to the metal layer to form a contact between the electrode and the metal layer, an insulating layer disposed between the first main surface and the metal layer, and a trench formed in the first main surface, the trench being filled with a conductive material, the connection substrate portion being electrically coupled to the metal layer via the trench.

According to an embodiment, a method of manufacturing a semiconductor device at least partially in a semiconductor substrate, the semiconductor substrate comprising a first and a second main surface, the first and the second main surfaces being opposed to each other, comprises forming a cell field portion and a contact area, the contact area being electrically coupled to the cell field portion. Forming the cell field portion comprises at least forming a transistor. The method further comprises insulating a part of the semiconductor substrate from other substrate portions to form a connection substrate portion, forming an electrode adjacent to the second main surface so as to be in contact with the connection substrate portion, forming an insulating layer over the first main surface, forming a metal layer over the insulating layer, forming a trench in the first main surface, and filling the trench with a conductive material, and electrically coupling the connection substrate portion to the metal layer via the trench.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIG. 1 schematically illustrates a general example of a layout of a semiconductor device;

FIG. 2B shows a cross-sectional view of a portion of a semiconductor device;

FIG. 5B illustrates a cross-sectional view of the semiconductor device shown in FIG. 5A;

FIG. 6 schematically illustrates a method of manufacturing a semiconductor device.

DETAILED DESCRIPTION

Figure 2A:
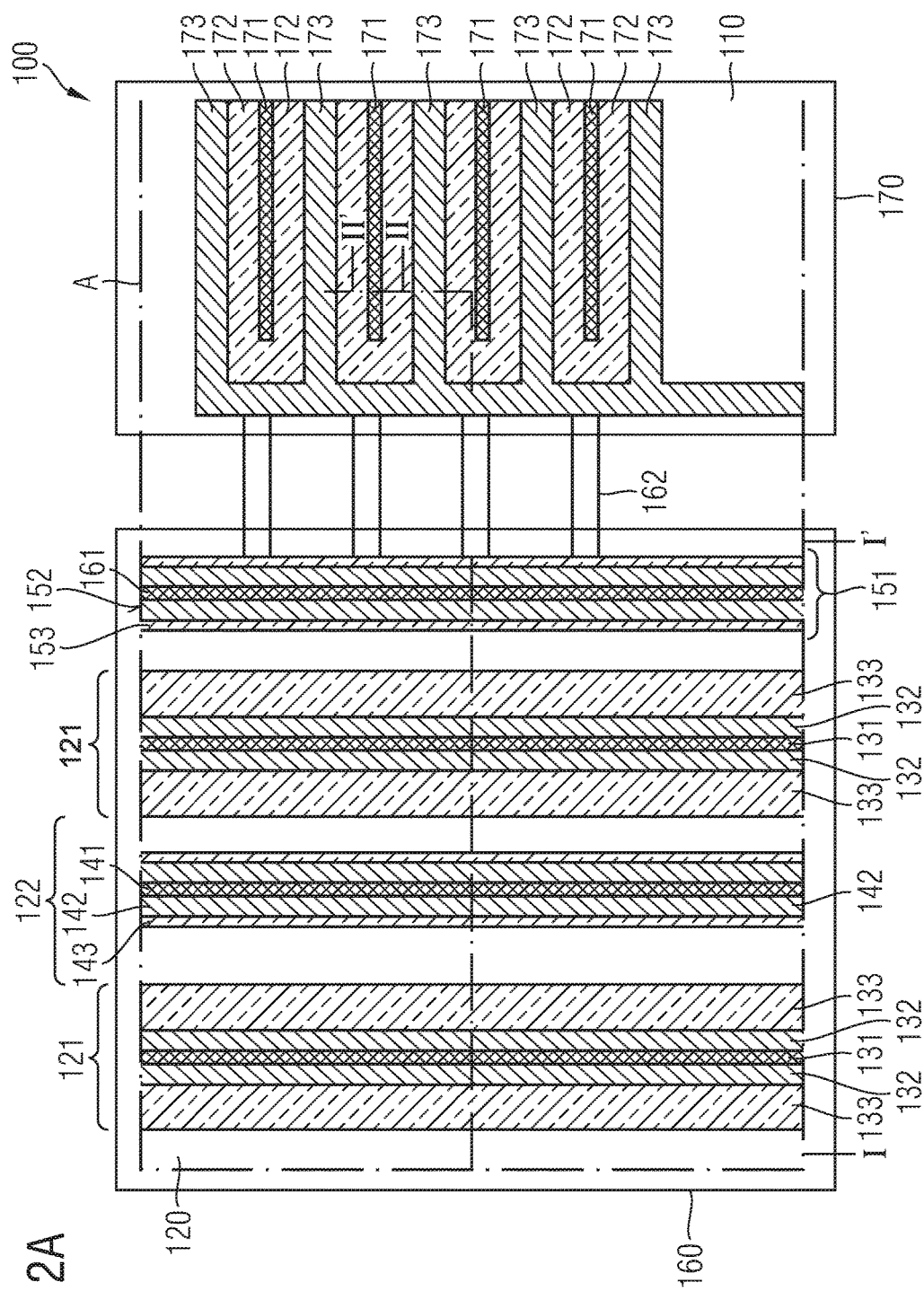
FIG. 2A shows a plan view of a portion of a semiconductor device.

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to embodiments of the present application, generally, silicon carbide (SiC) or gallium nitride (GaN) is a further example of the semiconductor substrate material.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The Figures and the description illustrate relative doping concentrations by indicating "−" or "+" next to the doping type "n" or "p". For example, "n$^-$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

The terms "lateral" and "horizontal" as used in this specification intend to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

FIG. 1 shows a plan view of a portion of a semiconductor device 100 comprising a cell field portion 110 including a plurality of vertical field effect transistors, and a contact area 120 which encloses the cell field portion 110. As is clearly to be understood, the illustrated shape of the contact area 120 and the cell field portion 110 are only by way of example. For example, the contact area 120 may be segmented and may have any arbitrary shape. As is indicated within the illustrated rectangle "A", there are contacts 162 between the cell field portion 110 and the contact area 120. For example, the contacts 162 may be implemented as trenches or may be disposed above the semiconductor substrate.

FIG. 2A shows a plan view of the rectangle "A" illustrated in FIG. 1. The semiconductor device 100 illustrated in FIG. 2A comprises a portion of the cell field portion 110 and a portion of the contact area 120. A source metal layer 170 is disposed over the cell field portion 110, and a so-called gate runner metal plate 160 is disposed over the contact area 120. The gate runner 160 usually is a metal plate disposed in contact with contact structures connected with gate electrodes in the cell field portion 110. The gate runner 160 is used for quickly applying a gate voltage to all of the gate electrodes of the cell field portion 110. Isolation trenches 121 are disposed in the contact area 120 and extend in a first direction. Further, substrate contact trenches 122 are disposed in the contact area 120 and also extend in the first direction. One substrate contact trench 122 is disposed between two isolation trenches 121. Gate contact trenches 151 also extend in the first direction. The gate contact trenches 151 are connected with cell field trenches 173 disposed in the cell field area 110 by means of contact trenches 162. The contact trenches 162 extend in a second direction that is perpendicular with respect to the first direction. Moreover, the cell field trenches 173 also extend in the second direction.

FIG. 2B shows a cross-sectional view of the semiconductor device illustrated in FIG. 2A. The cross-sectional view of FIG. 2B is taken between I and I' and between II and III as illustrated in FIG. 2A. As is shown, the semiconductor device shown in FIG. 2B is at least partially formed a semiconductor substrate 10, the semiconductor substrate 10 comprising a first and a second main surface 12, 11, the first and the second main surfaces 12, 11 being opposed to each other. The contact area 120 comprises a connection substrate portion 13 that is insulated from other substrate portions. The connection substrate portion 13 comprises a part of the semiconductor substrate 10. The connection substrate portion 13 is not electrically coupled to a component disposed in the cell field portion 110 by means of a conductive or semiconductor material that is disposed between the first and the second surfaces 12. As will be explained hereinafter, any contact to any component disposed in the cell field portion 110 is accomplished by a connection outside the semiconductor substrate 10, e.g. by a conductive layer that is formed over the first or second surface 12, 11 of the semiconductor substrate 10. An electrode 186 is disposed adjacent to the second main surface 11 of the connection substrate portion 13. The term "electrode" refers to any conductive element that enables an electrical contact to components which do not form part of the semiconductor device. For example, the "electrode" may be a portion of a conductive layer or may be a contact pad. The electrode 186 is in contact with the connection substrate portion 13. A metal layer (gate runner) 160 is disposed over the first main surface 12. The connection substrate portion 13 is electrically coupled to the metal layer 160. The connection substrate portion 13 may form an ohmic contact between the electrode 186 and the metal layer 160.

The metal layer 160 may comprise any metal, metal compound or metal alloy. The metal layer 160 comprises a metallic element. According to an embodiment, the metal layer 160 does not comprise polysilicon or other silicon-based materials. According to a further embodiment, the metal layer 160 does comprise polysilicon or other silicon-based materials. In the context of the present disclosure, the term "ohmic contact" between the electrode 186 and the metal layer 160 refers to a contact having an approximately constant ratio of voltage/current that does not depend from the polarity of the applied voltage. For example, the resistance of the connection substrate portion does not depend on the applied voltage. Further the resistance of the connection substrate portion 13 is not controlled, for example by applying a control voltage. According to an embodiment, any kind of control element for controlling the resistance of the connection substrate portion 13 is absent within the connection substrate portion 13. The term "ohmic contact" also encompasses contacts having a voltage/current characteristic which is not strictly linear but includes minor non-linearities. For example, the connection substrate portion 13 forms a low-ohmic interconnection, having a resistance of less than 1 Ohm. The connection substrate portion 13 comprises a part of the semiconductor substrate 10. Accordingly, the connection substrate portion 13 has a similar composition and may have the same crystalline structure as the semiconductor substrate 10. For example, the connection substrate portion 13 may comprise monocrystalline silicon. For example, the connection substrate portion 13 may be further doped and, consequently have a higher doping concentration or may be doped with materials different from the doping materials of further substrate portions.

An insulating layer 165 may be disposed between the first main surface 12 and the metal layer 160. The semiconductor device 100 may further comprise a conductive element 141, 142 which electrically couples the connection substrate portion 13 to the metal layer 160.

As is illustrated in the right-hand portion of FIG. 2B between II and II', the semiconductor device further comprises a transistor 14 arranged in the cell field portion 110. The transistor 14 comprises a source region 181, a drain region 182, a gate electrode 183 and a drift region 15. The source region 181 is connected to a source electrode 170 by means of a source contact 171. The drain region 182 is connected to a drain electrode 185. The source region 181 may be disposed adjacent to the first main surface 12, and the drain portion 182 may be disposed adjacent to the second main surface 11. The gate electrode 183 is disposed in a trench formed in the first main surface 12 of the substrate 10. The gate electrode 183 is insulated from the adjacent semiconductor material by means of a gate dielectric layer 172. A field electrode 184 may be disposed within the gate trench. The field electrode 184 may be electrically coupled to the gate electrode 173 or may be insulated therefrom. When a suitable voltage is applied to the gate electrode 183, a conductive channel is formed in the body region 16 adjacent to the gate electrode 183, resulting in a current flow from the source portion 181 to the drain region 182 via the conductive channel and the drift region 15.

As is illustrated in FIGS. 2A and 2B, the gate electrode 183 forms part of a conductive material arranged in a cell field trench 173 extending in the second direction. The conductive material is connected via the contacts 161 to the conductive material 152 that is disposed within the gate contact trenches 151 in a cross-section that is behind the depicted cross-section. The conductive material in the gate contact trenches 151 is connected to the gate runner 160 via contacts 161. The gate runner 160 is connected via the contacts 141 to the conductive material 142 within the substrate contact trenches 122 to the connection substrate portion 13.

The connection substrate portion 13 is usually heavily doped and thus has a high conductivity. Since the connection substrate portion 13 is insulated from the remaining substrate portions, only the connection substrate portion 13 is connected with the gate potential.

In the embodiment shown in FIG. 2B, the connection substrate portion 13 is insulated from the remaining substrate portions 10 by means of the isolation trenches 121. The isolation trenches 121 extend from the first to the second main surface 12, 11 and may be filled with a conductive material 132 insulated from the adjacent substrate portion by means of an insulating layer 133. In the embodiment illustrated in FIG. 2B, the conductive material 132 is connected via contacts 131 to the gate runner 160. Further, at the second main surface 11 of the substrate 10, the conductive material 132 is connected with the electrode 186. In the embodiment shown in FIG. 2B, the connection substrate portion 13 and the conductive material 132 of the isolation trenches 121 are electrically coupled to the electrode 186 that is held at gate potential. Accordingly, also the conductive material 132 in the isolation trenches is held at gate potential.

Nevertheless, according to further embodiments, the conductive material 132 in the isolation trenches 121 may also be held at a different potential, for example, source potential.

In FIG. 2B, the source metallization 170 and the gate metallization (gate runner) 160 are disposed adjacent to the first main surface 12 of the substrate 10. Further, the drain metallization 185 and a further gate metallization 186 are disposed on the second main surface 11 of the semiconductor substrate 10. The gate electrode 183 in the cell field portion 110 is connected via the cell field contact trenches 161 to the gate runner 160, and further via the substrate contact trench 122 and the connection substrate portion 13 to the gate metallization 186.

As is shown, the semiconductor device illustrated in FIG. 2B accomplishes an electrical contact from the first main surface 12 to the second main surface 11 by means of a connection substrate portion 13 which is insulated from the other substrate portions. The contact across the semiconductor substrate 10 is connected on both sides with a metal layer, whereby an electrical resistance is reduced. For example, the isolation trenches 121 may be filled with a conductive material 132, whereby an increased mechanical stability is achieved. As will be explained in the following, for forming the several trenches of the semiconductor device, standard processes are employed so that the manufacturing method may be implemented using normal processing steps which are performed for forming a semiconductor device.

According to another embodiment, the semiconductor device is at least partially formed in a semiconductor substrate. The semiconductor substrate comprises a first and a second main surface. The first and the second main surface are opposed to each other. The semiconductor device comprises a cell field portion and a contact area. The contact area is electrically coupled to the cell field portion, and the cell field portion comprises at least a transistor. The contact area comprises a connection substrate portion, being insulated from other substrate portions, the connection substrate portion comprising a part of the semiconductor substrate, an electrode being adjacent to the second main surface and being in contact with the connection substrate portion, and a metal layer disposed over the first main surface, the connection substrate portion being electrically coupled to the metal layer to form a contact between the electrode and the metal layer, an insulating layer disposed between the first main surface and the metal layer, and a trench formed in the first main surface, the trench being filled with a conductive material, the connection substrate portion being electrically coupled to the metal layer via the trench.

Figure 3A:
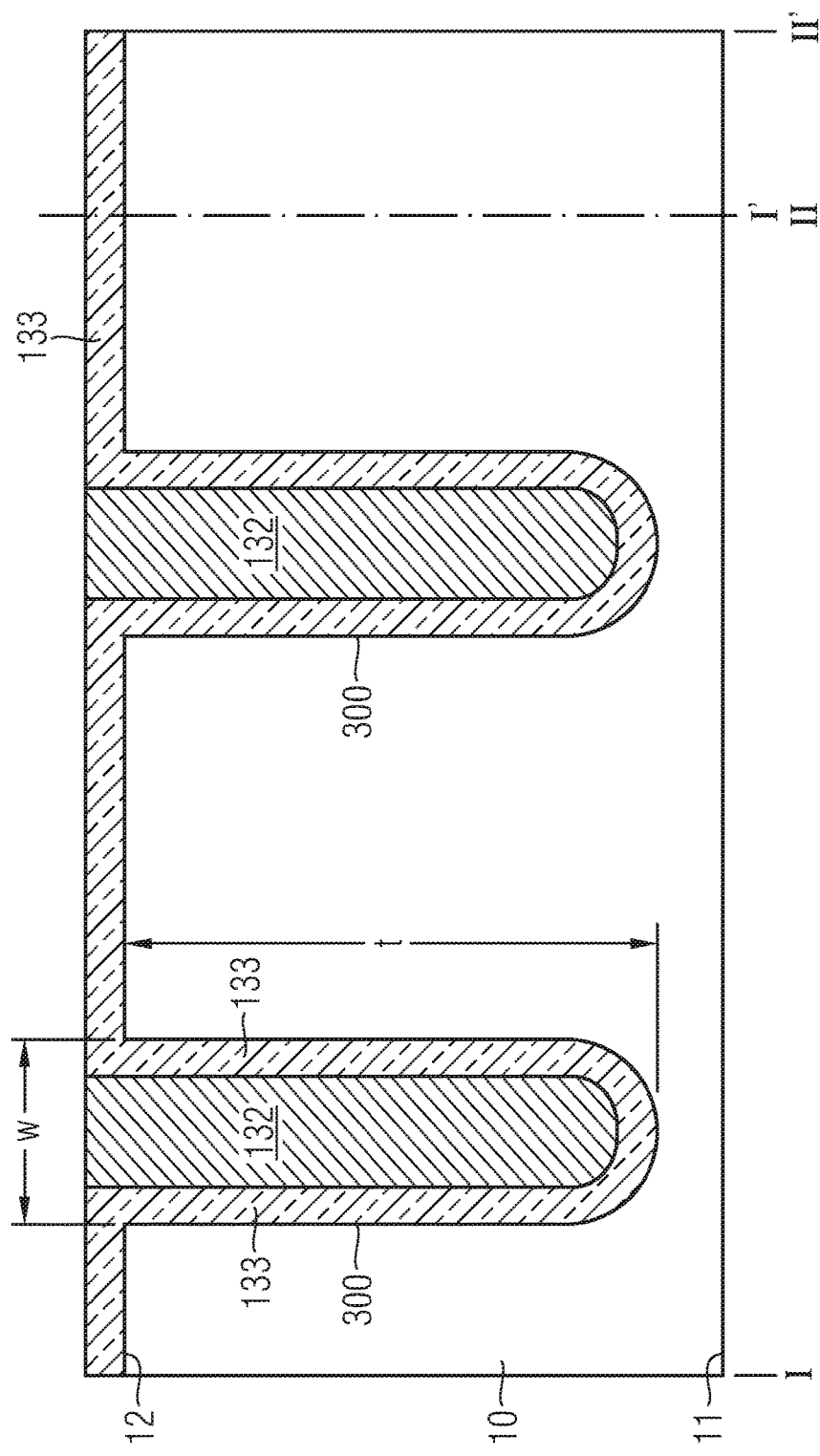
FIGS. 3A to 3D illustrate steps of manufacturing a portion of a semiconductor device according to an embodiment.

FIGS. 3A to 3D illustrate a method for manufacturing components of the semiconductor device. The cross-sectional view of FIG. 2B is taken between I and I' and between II and III as illustrated in FIG. 2A. Trenches 300 are etched in the first main surface 12 of a semiconductor substrate 10. The trenches 300 will act as isolation trenches of the completed semiconductor device. The trenches 300 may be etched to a depth t of 50 μm and may have a width w of 3 μm. As is to be clearly understood, different dimensions of the trenches 300 may be employed, depending on the processing and device requirements. Thereafter, an insulating layer 133 is formed over the surface of the substrate 10. For example, the insulating layer 133 may be a silicon oxide layer which is formed by thermal oxidation deposited by a LPCVD method, for example, using TEOS (tetraethyl orthosilicate) as a starting material. For example, the silicon oxide layer 133 may have a thickness of about 500 nm. Thereafter, a conductive material 132 is filled in the trenches 300. For example, the conductive material 132 may be polysilicon. Thereafter, a CMP (chemical-mechanical polishing) step is performed so as to remove the remaining conductive material 132 from the main surface of the substrate 10. FIG. 3A shows an example of the resulting structure.

Thereafter, an etching step is performed so as to recess the polysilicon filling 132 within the trenches 300. For example, about 500 nm of the conductive material 132 may be removed, the thickness of the etched silicon corresponding to the thickness of the horizontal insulating layer 133 over the substrate surface 12. Thereafter, an etching step is performed so as to etch the silicon oxide layer 133.

Figure 3B:
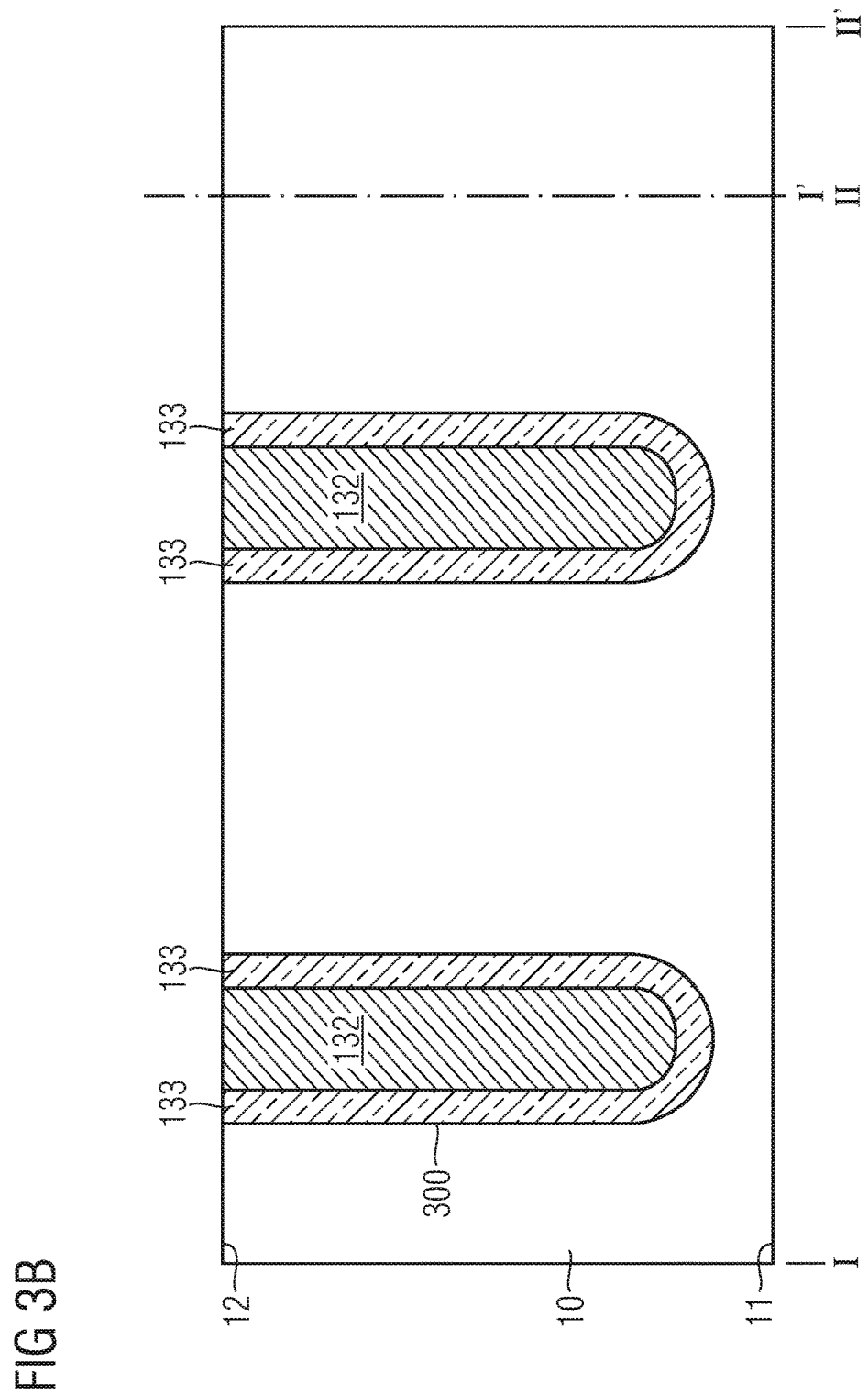

FIG. 3B shows an example of a resulting structure. As is shown, the trenches 300 are disposed in the first main surface 12 of the semiconductor substrate 10. The sidewalls of the trenches 300 are covered by an insulating layer 133 and the interior of the trenches 300 is filled with a conductive material 132.

Thereafter, further trenches are formed in the first main surface 12 of the semiconductor substrate. For example, substrate contact trenches 122 are etched into the first main surface 12 of the semiconductor substrate 10. Further, gate contact trenches 151 are etched and gate trenches 173 are etched in the cell field portion 110. According to an embodiment, the substrate contact trenches 122 are etched to a deeper depth than the gate trenches 173. For example, the substrate contact trenches 122 may be etched to reach a heavily doped substrate portion. Due to the contact to the heavily doped substrate portion, the contact resistance can be further reduced.

Then, an insulating layer 153, 172, 143 such as silicon oxide is deposited over the resulting surface of the semiconductor substrate 10. Using a lithographic mask, an anisotropic spacer etching is accomplished so as to remove horizontal portions of the silicon oxide layer 143 within the substrate contact trench 122. As a result, the silicon oxide layer 143 remains at the sidewalls of the trench 310, whereas no silicon oxide layer is present at the bottom side of the trench 122.

Alternatively, an isotropic etching method may be employed so that the insulating material is also removed from the sidewalls of the substrate 10. Due to the use of the lithographic mask, the silicon oxide layer 143 remains in the trenches 320, 330 and on the second surface 12 of the semiconductor substrate 10. Optionally, an implantation step may be performed, using arsenic or phosphor ions as an implantation material and an annealing step may be performed in order to achieve a low-ohmic contact to the connection substrate portion 13. Thereafter, a conductive material such as polysilicon is deposited in the trenches 122, 320, 330.

Figure 3C:
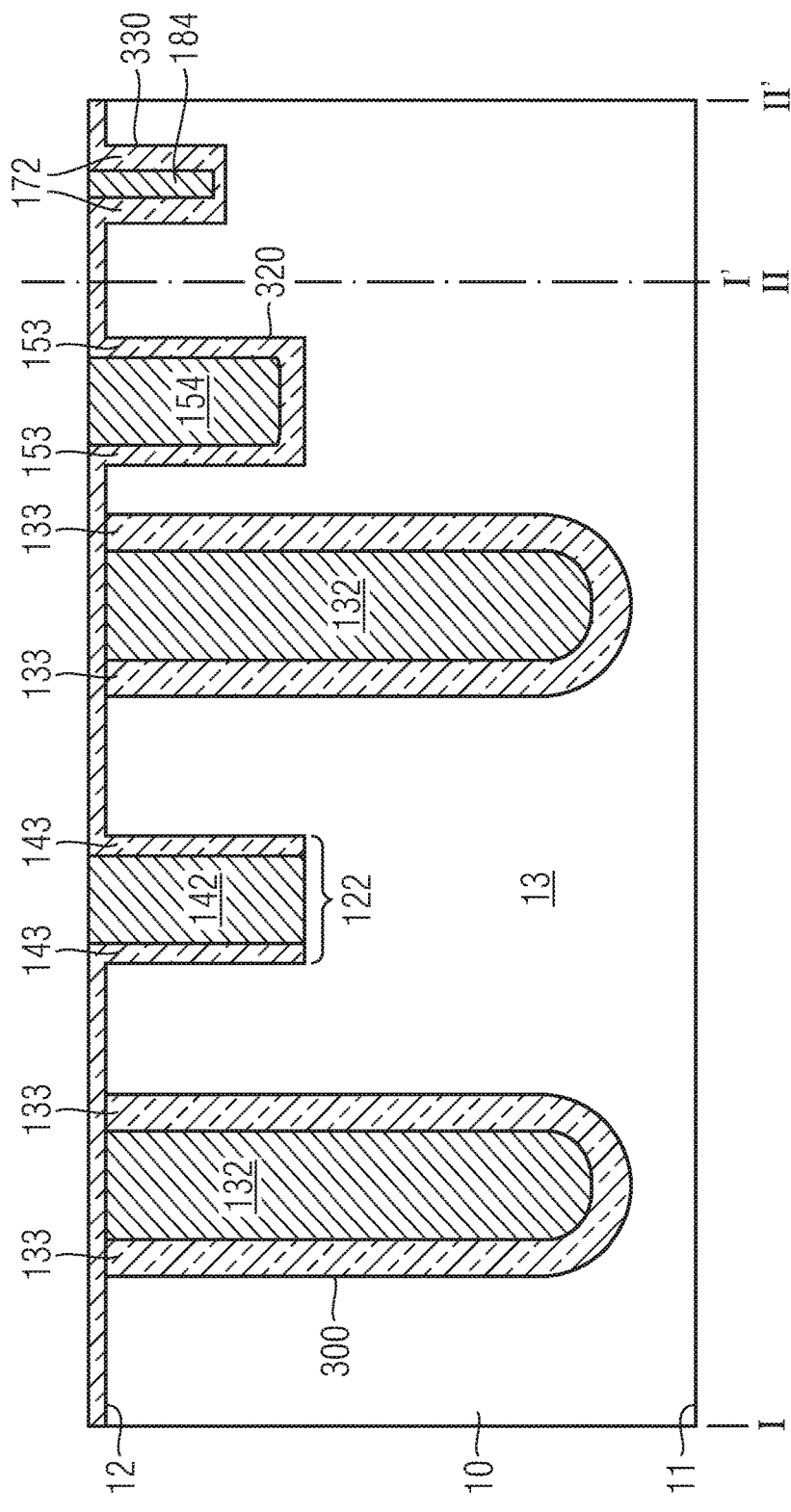

FIG. 3C shows a cross-sectional view of the resulting structure. As is shown in FIG. 3C, conductive material 142 is present in the substrate contact trench 122, conductive material 154 is disposed in the gate connection trench 320 and conductive material 184 is formed in the cell field trench 330.

Figure 3D:
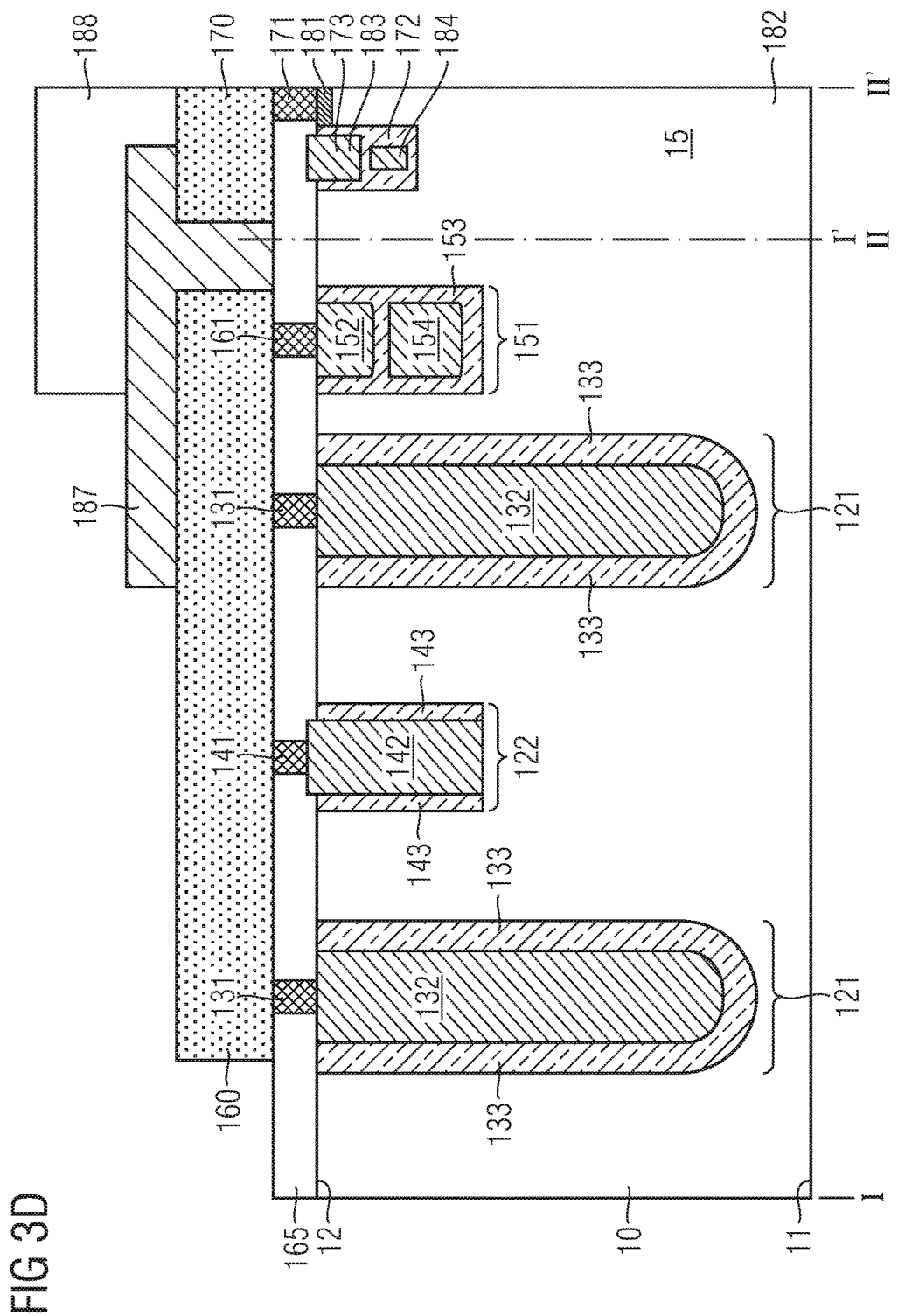

Thereafter, a further CMP step is performed so as to remove the remaining polysilicon material from the substrate surface. Then, contacts are defined to the conductive material in the trenches. For example, contacts 131 are formed to the conductive material 132 in the isolation trenches 121. Further, a contact 141 is formed to the conductive material 142 in the substrate contact trench 122. Moreover, a contact 161 is formed to the conductive material in the gate contact trench 151 as is conventional. Further, gate electrodes are formed within the gate trench 330 as is conventional. For example, this may be accomplished by etching back the conductive material and insulating material present within these trenches, depositing a further oxide layer to insulate the field plate 184 from the gate electrode 183 and depositing a further conductive material. As is shown in FIG. 3D, a conductive material such as polysilicon 152 is formed in the gate contact trench 151. Further, a gate electrode 183 is formed in the cell field trench 173.

Then, metallization layers are formed and patterned so that a gate runner 160 is disposed to be in contact with the substrate connection material 142 and the conductive material 132 in the isolation trenches 121. Further, the gate runner 160 is connected with the gate contact trench 151. Moreover, a source electrode 170 is formed so as to be in contact with the source region 181 of the transistors by means of the source contact 171. Further insulating layers such as an imide layer 187 may be formed so as to insulate the source metal layer 170 and the gate runner 160 from each other. Further, a power Cu layer 188 may be formed so as to be in contact with the source metal 170 in order to achieve a low resistance connection.

FIG. 3D shows an example of a cross-sectional view of the resulting structure.

Thereafter, processing steps are performed on the back side 11 of the semiconductor substrate 10. For example, the top surface 12 of the semiconductor substrate 10 may be supported by a suitable carrier and a grinding step may be performed so as to remove the lower portion of the substrate material adjacent to the second main surface 11 and to open the isolation trenches 300. In a next step, a CMP polishing step is performed so as to cure or compensate for damages that may be caused by grinding. The CMP polishing step may also remove the silicon oxide layer at the bottom portion of the trenches 300. Then, metal layers may be formed on the second main surface 11 of the semiconductor substrate 10. For example, metal layers comprising AlTiCu, AuSn or CuSn may be deposited and may be patterned photolithographically. Thereafter, passivation layers may be formed so as to insulate adjacent metal portions from each other. FIG. 2B shows an example of a resulting structure. According to a further embodiment, an insulating layer such as silicon oxide may be formed on the second main surface 11 of the semiconductor substrate 10 followed by forming contact holes in the insulating layer and one or more metal layers so as to accomplish an electric back side contact.

Figure 4:
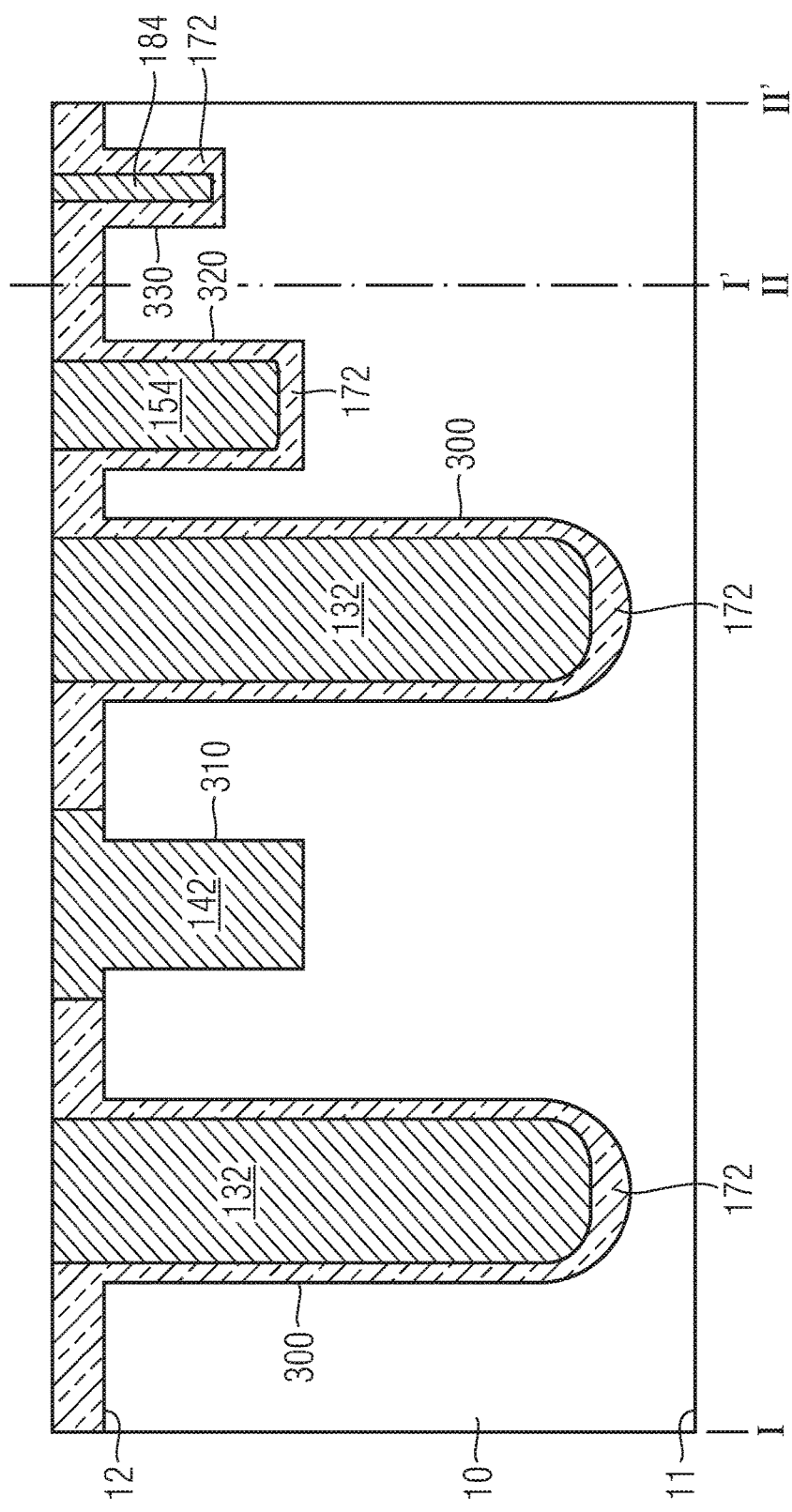
FIG. 4 illustrates further steps when manufacturing a semiconductor device according to a further embodiment.

FIG. 4 shows a further embodiment according to which all trenches 300, 310, 320, 330 are etched before depositing the insulating layer 172 and the conductive layer 132, 154, 142 and 184 in the respective trenches. According to this embodiment, first, an oxide layer is deposited, the oxide layer having a thickness of approximately 75 to 120 nm. Then a lithographic step is performed so as to remove the insulating material from the substrate contact trench 310. According to the embodiment shown in FIG. 4, the insulating layer may be removed from the sidewalls and the bottom of the trench 310. Alternatively, the insulating layer may be removed only from the bottom of the trench 310. Thereafter, a conductive material is filled in all trenches 300, 310, 320, 330. For example, the silicon layer may have a thickness of approximately 1.5 µm. In the following, a CMP step is performed so as to remove the horizontal portions of the polysilicon layer. Thereafter, the further steps as described with reference to FIG. 3D are performed. No silicon oxide layer is present on the sidewalls of the substrate contact trench 310. As a result, the resistance from the conductive material 142 to the connection substrate portion 13 is further reduced.

Figure 5A:
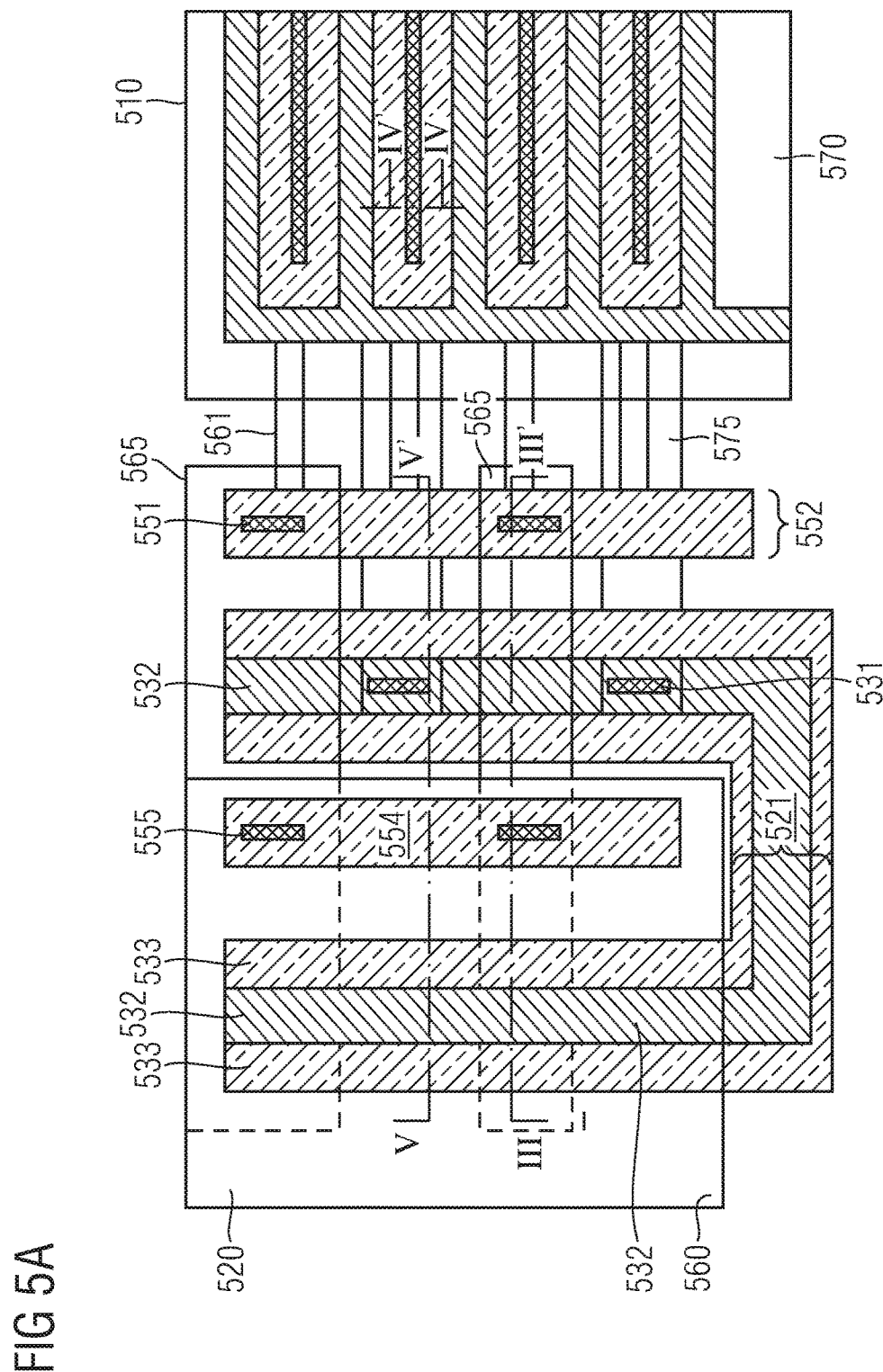
FIG. 5A illustrates a plan view of a portion of a semiconductor device according to a further embodiment.
Figure 5C:
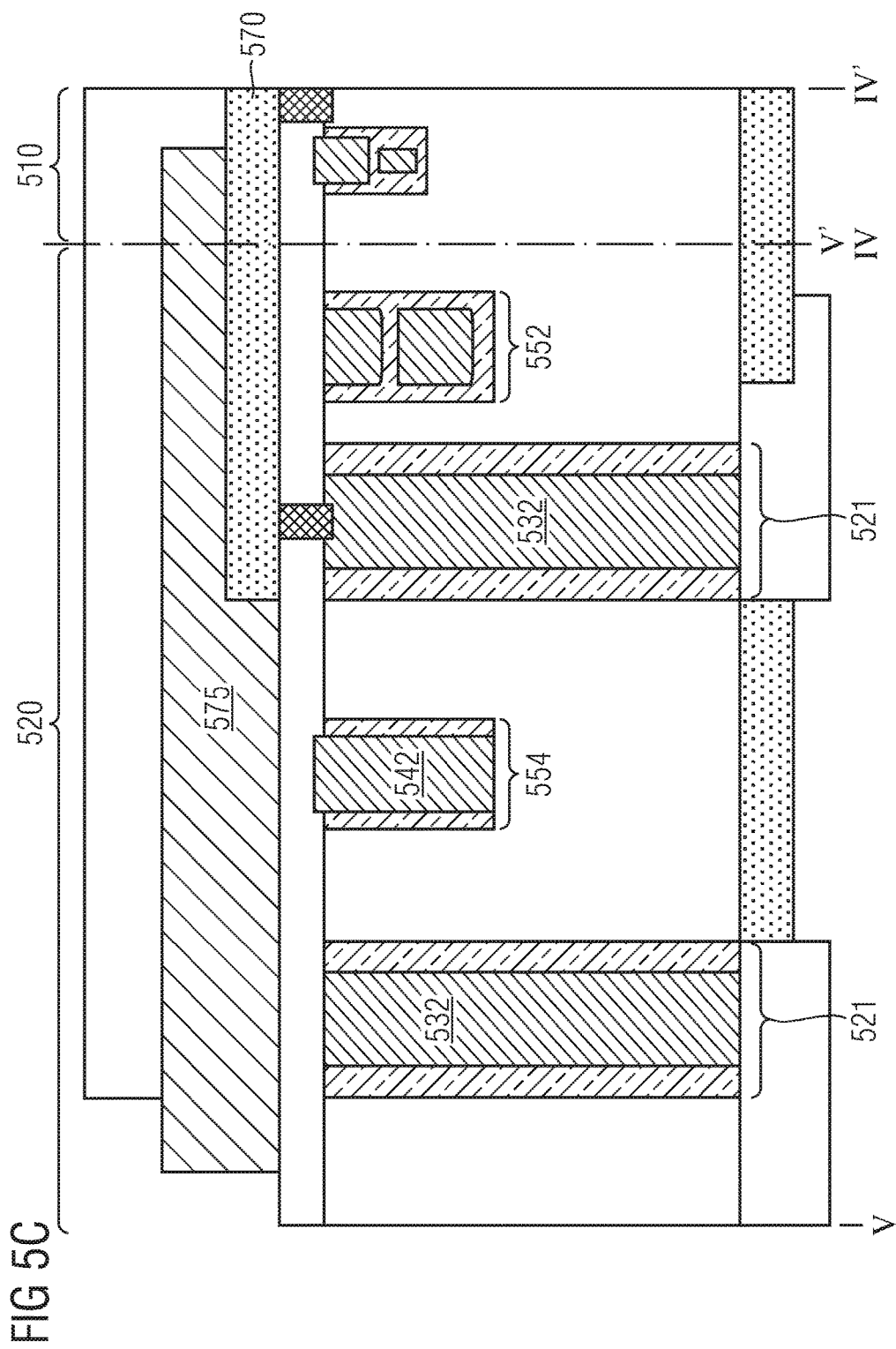
FIG. 5C illustrates a cross-sectional view of the semiconductor device shown in FIG. 5A.

FIGS. 5A to 5C show a further embodiment of the present application according to which the conductive material within the isolation trenches is connected with the source electrode and, hence, the isolating trenches are held at a source potential. In FIG. 5A, the right-hand portion of the drawing showing the cell area 510 is very similar to the components of the right-hand portion of FIG. 2A. Nevertheless, on the left-hand portion of FIG. 5A, metal plates 560, 575 are patterned in a manner different from the metal plate forming the gate runner 160 in FIG. 2A in the left-hand portion. To be more specific, the metal layer over the contact area 520 is patterned so that the conductive material 542 (shown in FIGS. 5B and 5C) in the substrate contact trench 554 is connected by means of contacts 555 with the gate runner 560. Moreover, there is no electrical contact between the conductive material 532 in the isolation trenches and the gate runner. The conductive material 532 in the isolation trenches is in contact with the source contact plate 575 that extends in the second direction. The source contact plate 575 is coupled to the source metal 570 present in the cell field portion 510. The conductive material 565 that is in contact with the gate runner 560 contacts the substrate contact trenches 554 by means of contacts 555 and the gate contact trenches 552 by means of the contacts 551.

FIGS. 5B and 5C illustrate cross-sectional views of the embodiment shown in FIG. 5A. The cross-sectional view of FIG. 5B is taken between III and III' and between IV and IV' as shown in FIG. 5A. The cross-sectional view of FIG. 5C is taken between V and V' and between IV and IV' as shown in FIG. 5A. In FIGS. 5B and 5C the components having the same numerals as those illustrated in FIGS. 2 to 4 illustrate the same components.

FIG. 5B shows a cross-section, in which the conductive material 565 is in contact with the connection substrate portion 13 via the substrate contact trench 554. Further, the conductive material 565 is coupled to the gate contact trench 552.

FIG. 5C shows a cross-section, in which the conductive material 532 in the isolation trench 521 is coupled to the source contact plate 575. The source contact plate 575 is coupled to the source metal 570 present in the cell field portion 510. As is illustrated in FIG. 5A, the isolation trenches 521 have a "U"-shape, so that the isolation trench 121 disposed on the right-hand side of the connection substrate portion 13 and the isolation trench 121 disposed on the left-hand side of the connection substrate portion 13 are electrically coupled.

FIG. 6 illustrates a method of manufacturing a semiconductor device at least partially in a semiconductor substrate. The semiconductor substrate comprises a first and a second main surface, the first and the second main surfaces being opposed to each other. As is illustrated, the method comprises insulating a part of the semiconductor substrate from other substrate portions to form a connection substrate portion (S101), forming an electrode adjacent to the second main surface so as to be in contact with the connection substrate portion (S102), forming a metal layer over the first main surface (S103), and electrically coupling the connection substrate portion to the metal layer (S104), thereby forming an ohmic contact between the electrode and the metal layer.

In the embodiments of FIGS. 3 and 4 an interconnection to a transistor has been described. Nevertheless, this interconnection may also be applied to further applications such as sensor applications that are contacted by such an interconnection scheme. Accordingly, the semiconductor device may further comprise a sensor that is disposed adjacent to the first main surface 12. In this case, the sensor signal may be fed to the second main surface 11 via elements of the semiconductor substrate described above.

While embodiments of the invention have been described above, it is obvious that further embodiments may be implemented. For example, further embodiments may comprise any subcombination of features recited in the claims or any subcombination of elements described in the examples given above. Accordingly, this spirit and scope of the appended claims should not be limited to the description of the embodiments contained herein.

What is claimed is:

1. A method of manufacturing a semiconductor device at least partially in a semiconductor substrate, the semiconductor substrate comprising a first and a second main surface, the first and the second main surfaces being opposed to each other, the method comprising forming a cell field portion and a contact area, the contact area being electrically coupled to the cell field portion, the cell field portion comprising at least a transistor comprising a gate electrode, wherein the contact area is formed by:
   forming a connection substrate portion insulated from other substrate portions and comprising a part of the semiconductor substrate;
   forming isolation trenches extending from the first main surface to the second main surface, wherein the connection substrate portion is insulated from other substrate portions by the isolation trenches; and
   forming an electrode adjacent to the second main surface and in contact with the connection substrate portion,
   the method further comprising electrically coupling the gate electrode of the transistor of the cell field portion to the electrode adjacent to the second main surface in the contact area via the connection substrate portion.

2. The method according to claim 1, wherein electrically coupling the gate electrode of the transistor of the cell field portion to the electrode in the contact area comprises forming a metal layer over the first main surface and electrically coupling the connection substrate portion to the metal layer to form a contact between the electrode and the metal layer.

3. The method according to claim 2, wherein electrically coupling the gate electrode of the transistor of the cell field portion to the electrode in the contact area further comprises forming a cell field contact trench in the cell field portion and electrically coupling the gate electrode in the cell field portion to the metal layer via the cell field gate contact trench.

4. The method according to claim 3, wherein the gate trench has a longitudinal axis running in a first direction and the cell field contact trench has a longitudinal axis running in a second direction intersecting the first direction.

* * * * *